(12) United States Patent
Dalessandro et al.

(10) Patent No.: US 10,483,935 B2
(45) Date of Patent: Nov. 19, 2019

(54) FILTER

(71) Applicant: Schaffner EMV AG, Luterbach (CH)

(72) Inventors: Luca Dalessandro, Zürich (CH);
Martin Wüthrich, Belp (CH); Norbert Häberle, Lommiswil (CH)

(73) Assignee: Schaffner Emv AG, Luterbach (CH)

( * ) Notice: Subject to any disclaimer, the term of this patent is extended or adjusted under 35 U.S.C. 154(b) by 234 days.

(21) Appl. No.: 15/594,268

(22) Filed: May 12, 2017

(65) Prior Publication Data

US 2017/0331448 A1    Nov. 16, 2017

(30) Foreign Application Priority Data

May 13, 2016  (DE) .................... 20 2016 102 587 U
Mar. 10, 2017  (EP) ..................................... 17160432

(51) Int. Cl.
| | |
|---|---|
| *H03H 7/01* | (2006.01) |
| *H01F 27/02* | (2006.01) |
| *H01F 27/08* | (2006.01) |
| *H02M 1/12* | (2006.01) |
| *H05K 7/20* | (2006.01) |

(Continued)

(52) U.S. Cl.
CPC ......... *H03H 7/0115* (2013.01); *H01F 27/025* (2013.01); *H01F 27/085* (2013.01); *H02K 7/14* (2013.01); *H02M 1/126* (2013.01); *H03H 1/00* (2013.01); *H03H 7/1758* (2013.01); *H03H 7/54* (2013.01); *H05K 7/20909* (2013.01); *H03H 2001/0021* (2013.01)

(58) Field of Classification Search
CPC .......... H03H 7/54; H03H 1/00; H03H 7/0115;
H03H 7/1758; H03H 2001/0021; H01F 27/025; H01F 27/085; H02K 7/14; H02M 1/126; H05K 7/20909
USPC ....................................................... 333/185
See application file for complete search history.

(56) References Cited

U.S. PATENT DOCUMENTS 4,548,548 A * 10/1985 Gray, III .................. F01P 5/06
                                                123/41.49
8,115,571 B2   2/2012 Pietkiewicz et al.
(Continued)

FOREIGN PATENT DOCUMENTS

CA          2498993 A1    9/2006

OTHER PUBLICATIONS

European Search Report for EP Application No. 17160432.5, dated Sep. 26, 2017, 8 pages.

*Primary Examiner* — Benny T Lee
*Assistant Examiner* — Hafizur Rahman
(74) *Attorney, Agent, or Firm* — Blank Rome LLP (57) ABSTRACT

A filter with three phases comprising for each phase an input terminal, an output terminal and a capacitor, wherein for each of the three phases the input terminal is electrically connected via a connection point to the output terminal, wherein the connection points of the three phases are electrically connected via the three capacitors in star and/or delta form, wherein the filter comprises a housing containing two coil blocks, wherein the housing comprises a first side and a second side opposite the first side, wherein the two coil blocks are arranged along a line between the first side and the second side, wherein a fan for cooling the two coil blocks is arranged on the first side of the housing, wherein the larger of the two coil blocks is arranged between the fan and the smaller of the two coil blocks.

19 Claims, 3 Drawing Sheets

(51) Int. Cl.
*H02K 7/14* (2006.01)
*H03H 1/00* (2006.01)
*H03H 7/54* (2006.01)

(56) References Cited

U.S. PATENT DOCUMENTS

2010/0156194 A1 6/2010 Navid et al.
2015/0351278 A1 12/2015 Shirouzu
2015/0380147 A1 12/2015 Takano

* cited by examiner

Fig. 6 Fig. 7

FILTER

CROSS-REFERENCE TO RELATED APPLICATIONS

This application claims priority to German utility model application 20 2016 102 587.7 filed on May 13, 2016 and European patent application 17160432.5 filed on Mar. 10, 2017. The contents of these applications are hereby incorporated by reference.

TECHNICAL FIELD

The invention relates to a filter, in particular the structural arrangement of the filter elements in the housing of said filter.

PRIOR ART

Filters in three-phase electrical grids having a coil in each current-carrying phase and a coil and a capacitor between a connection point of each phase and a star point are generally known. Optionally, such filters comprise a third coil downstream of the connection point. The inductance of the first, second and third coils decreases in this order, such that the spatial extent of a first coil block comprising the first coils is also larger than that of a second coil block comprising the second coils. If there is a third coil block comprising the third coils, the spatial extent of the second coil block is larger than that of the third coil block. It is likewise known that in the case of relatively high currents the coils heat up greatly and require an active cooling for example by means of a fan, in order to limit the heat loss. A further problem of these filters is the large space requirement and the great weight of the coil blocks and of the capacitors. This makes it more difficult for example to mount such a filter on a vertical wall.

US2015/0380147 describes an LCL filter arranged in a housing arranged on rollers. The larger coil block here is arranged at the bottom side, while the fan is arranged on the opposite side of the larger coil block.

SUMMARY OF THE INVENTION

It is an object of the invention to design a filter that overcomes the problems of the prior art.

In one embodiment, the filter comprises for each of the three phases an input terminal, an output terminal and a capacitor, wherein for each of the three phases the input terminal is electrically connected via a connection point to the output terminal, wherein the connection points of the three phases are electrically connected via the three capacitors in star and/or delta form, wherein the filter comprises a housing containing two coil blocks, wherein the housing comprises a first side and a second side opposite the first side, wherein the two coil blocks are arranged along a line between the first side and the second side, wherein a fan for cooling the two coil blocks is arranged on the first side of the housing. The two coil blocks are selected from the following three coil blocks: A first coil block having three first coils, wherein for each of the three phases one of the three first coils is connected between the connection point and the input terminal. A second coil block having three second coils, wherein the connection points of the three phases are electrically connected via the three second coils and the three capacitors in star and/or delta form. A third coil block having three third coils, wherein for each of the three phases one of the three third coils is connected between the connection point and the output terminal.

In one embodiment, the filter comprises for each phase an input terminal, an output terminal, a first coil, a second coil and a capacitor, wherein for each of the three phases the input terminal is electrically connected to the output terminal via the first coil, wherein for each of the three phases the first coil is connected between a connection point and the input terminal, wherein the connection points of the three phases are electrically connected via the three second coils and the three capacitors in star and/or delta form, wherein the filter comprises a housing containing a first coil block having the first coils of the three phases and a second coil block having the second coils of the three phases, wherein the housing comprises a first side and a second side opposite the first side, wherein the first coil block and the second coil block are arranged along a line between the first side and the second side.

In one embodiment, the larger of the two coil blocks is arranged between the fan and the smaller of the two coil blocks. It has surprisingly been found that the arrangement of the spatially largest coil block in front of the fan reduces the heat loss the most effectively, even though the smaller coil block or the smaller coil blocks is/are arranged in the wind shadow of the larger coil block and is/are thus scarcely cooled. Since the largest coil block makes the largest contribution to the heat loss, it appears to be more effective to cool only the largest coil block with a maximum cooling power compared with cooling all three coil blocks with an average cooling power. By virtue of the arrangement of the larger coil block at the fan, the air speed is also greater at the larger coil block than at the smaller coil block and the cooling is thus more effective.

In one embodiment, the housing tapers from the first side towards the second side. This allows the total space requirement of the housing to be reduced since large coil blocks can be arranged on the first side and small coil blocks can be arranged on the second side. Consequently, the housing size is maximal only in the region of the largest coil block and can decrease towards the smaller coils. If the air flow moves from the first side of the housing to the second side thereof, a kind of chimney effect results which generates a particularly laminar flow in the housing and thus creates better heat dissipation. At the same time, the air flow is guided behind the first coil block again back to the smaller second coil block and possibly third coil block. Consequently, the tapering provides for better cooling of the smaller second coil and possibly third coil behind the first coil. This effect is intensified further if the filter comprises a mounting side comprising fixing means in order to suspend the filter on a vertical wall such that the second side is directed towards the base. Preferably, the tapering of the housing is achieved by an oblique housing wall/side, preferably a side arranged opposite the mounting side of the filter. This last has the advantage that the centre of gravity of the filter moves closer to the wall than would be the case for a rectangular housing, particularly if further components such as e.g. the capacitors and/or a third coil block are mounted on the tapering housing wall arranged opposite the mounting side. The forces acting on the wall suspension are reduced as a result.

In one embodiment, the three coil blocks mentioned above are arranged in a descending fashion in terms of size in a line between the first side of the housing and the second side of the housing. This is advantageous particularly in combination with the tapered housing since the third coil block is still cooled sufficiently.

In one embodiment, the third coil block is arranged on the exterior of a side of the housing which is opposite the mounting side of the filter. The housing can be shortened as a result. Preferably, the third or the third largest coil block is arranged above the second or the second largest coil block and a cutout is provided in that side of the housing which carries the third coil block, in order to guide at least part of the air flow of the fan from the housing to the third coil block.

In one embodiment, the filter is fixed on a vertical wall, such that the first side is directed downwards and the second side of the housing is directed upwards. This improves the heat dissipation since the heat ascends and thus moves in the same direction as the air flow of the fan. Wall mounting additionally has the advantage that beneath the filter there is enough clearance with respect to the base and the fan can draw in enough air on the underside of the filter.

BRIEF DESCRIPTION OF THE FIGURES

The invention is explained in greater detail with reference to the accompanying figures, wherein.

WAYS OF IMPLEMENTING THE INVENTION

Figure 1:
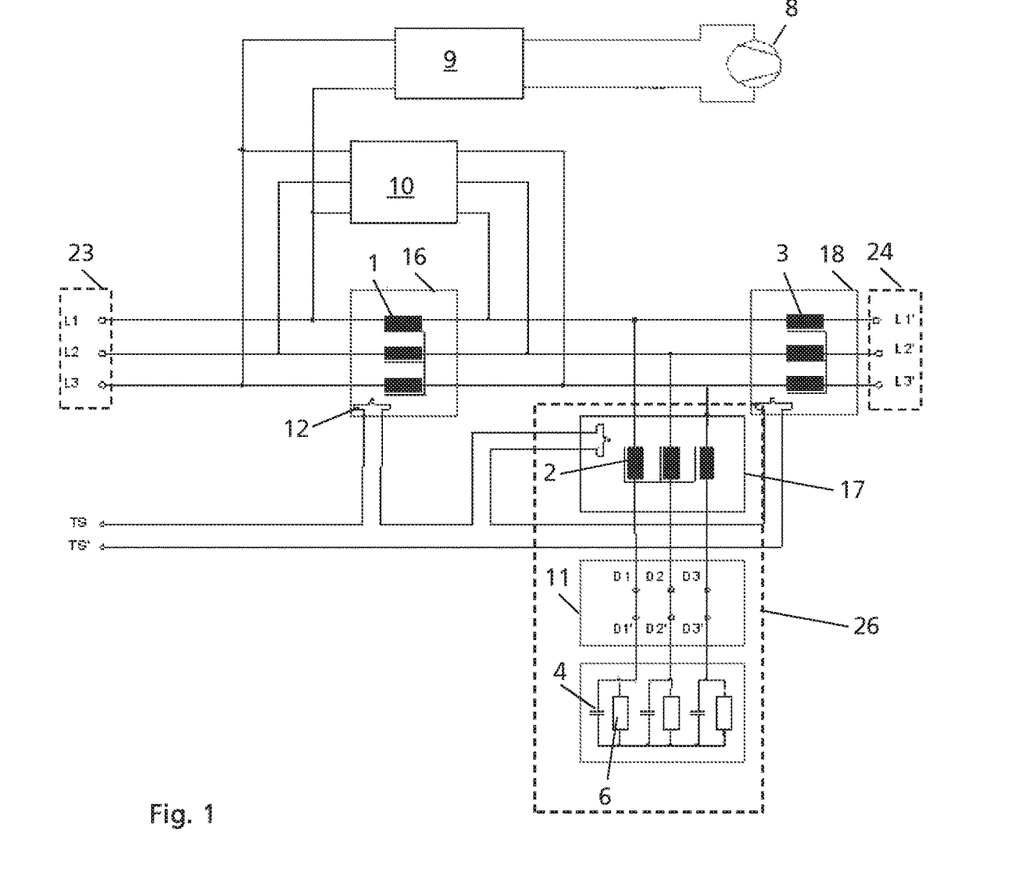
FIG. 1 shows a circuit diagram of one exemplary embodiment of the filter.
Figure 2:
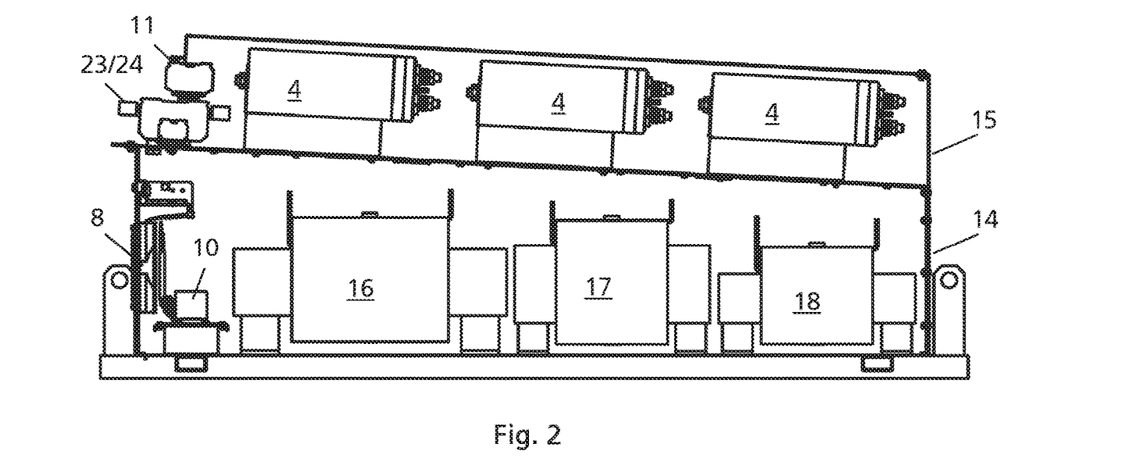
FIG. 2 shows a section through a first exemplary embodiment of the filter.
Figures 3, 4:
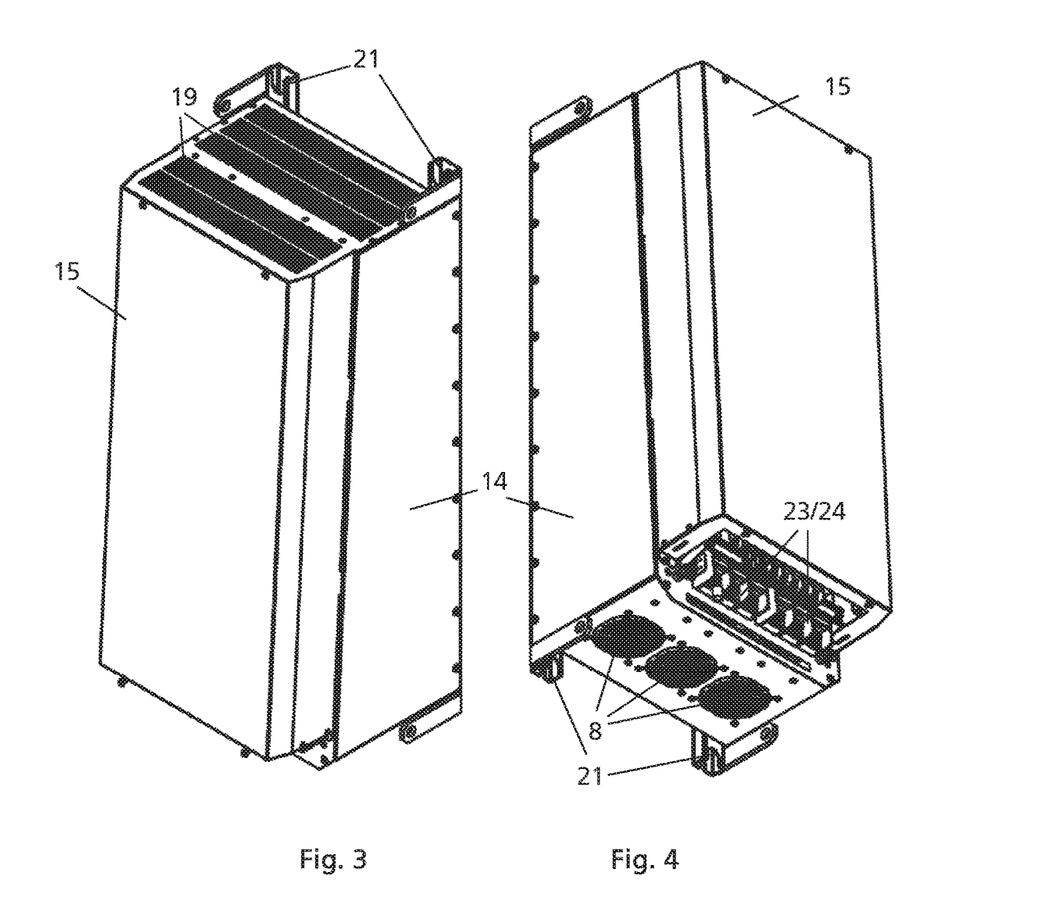
FIG. 3 shows a first three-dimensional view of the first exemplary embodiment of the filter.
FIG. 4 shows a second three-dimensional view of the first exemplary embodiment of the filter.
Figure 5:
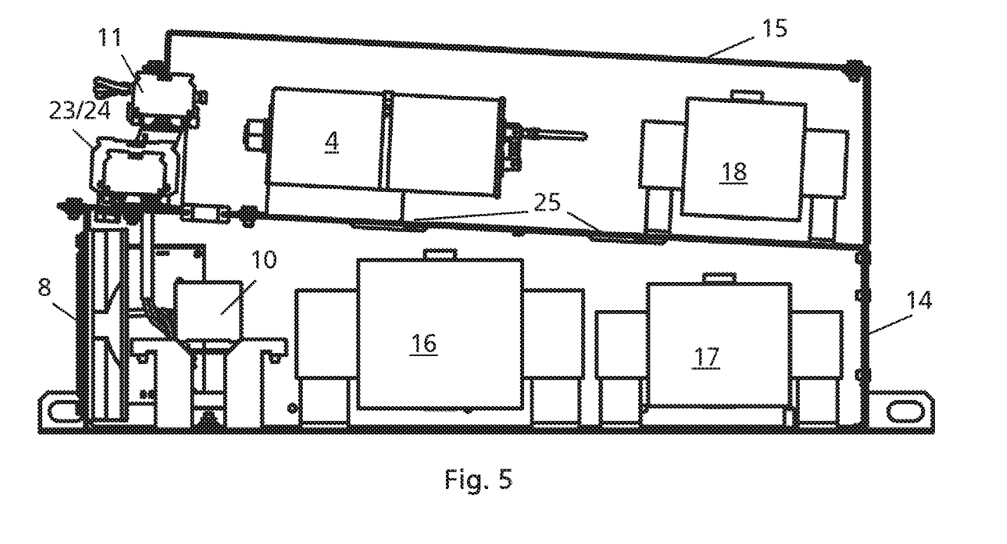
FIG. 5 shows a section through a second exemplary embodiment of the filter.
Figure 6:
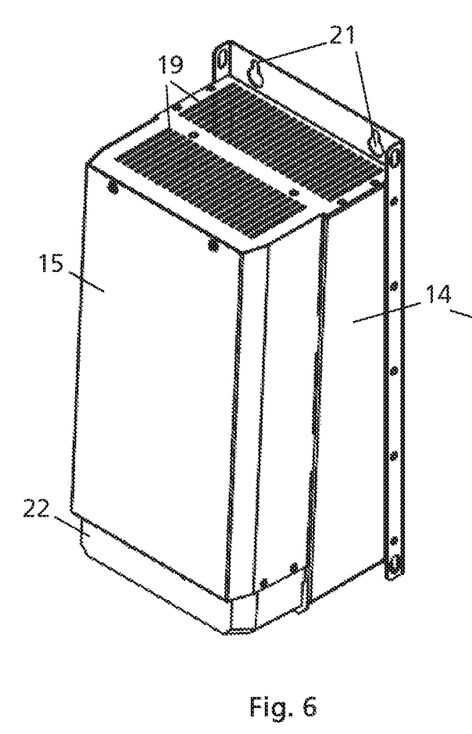
FIG. 6 shows a first three-dimensional view of the second exemplary embodiment of the filter.
Figure 7:
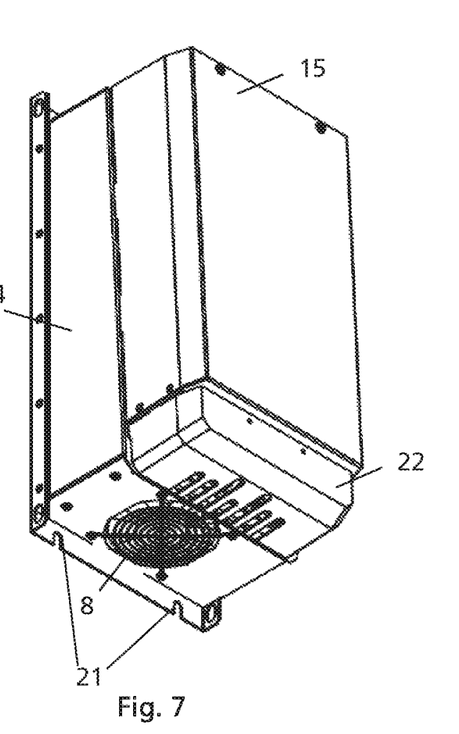
FIG. 7 shows a second three-dimensional view of the second exemplary embodiment of the filter.

FIG. 1 shows one exemplary embodiment of the electrical circuit of the filter, which is embodied as a three-phase filter. FIGS. 2 to 4 show a first exemplary embodiment of the design of a filter. FIGS. 5 to 7 show a second exemplary embodiment of the design of a filter. Filters for power ranges of greater than 1 kW (kilowatt) are preferably involved here.

The filter comprises three input terminals, three output terminals, a first coil block 16, a second coil block 17, three capacitors 4 and a housing 14. Optionally, the filter can further comprise at least one of a fan 8, a third coil block 18, three resistors 6, a damping block 10, a power block 9 for the fan 8 and a switching module 11.

The first coil block 16 comprises three first coils 1, one for each phase L1, L2 and L3 in a three-phase electrical grid. The second coil block 17 comprises three second coils 2, one for each of the phases L1, L2 and L3. The optional third coil block 18 comprises three third coils 3, one for each of the phases L1, L2 and L3. Preferably, the three coils 1, 2 or 3 of the coil blocks 16, 17 and/or 18 are inductively connected via a common core. Preferably, the three coils of a coil block have the same inductances. Optionally, one or a plurality of the coil blocks 16, 17 or 18 can comprise an auxiliary winding 12 in order to detect excessively large currents, short circuits or cooling disturbances. These disturbance current measurements can be tapped off at two terminals TS and TS'.

The three input terminals 23 are electrically connected to the three corresponding output terminals 24 via three electrical conductors. In this case, each input terminal 23, each electrical conductor and each output terminal correspond to one of the three phases L1, L2, L3, such that per phase one of the three input terminals 23 is electrically connected to one of the three output terminals 24 via one of the three electrical conductors. The three input terminals 23 are preferably connected to a three-phase grid. The three output terminals 24 are preferably connected to a three-phase load. However, converters, further filters or other devices can also be connected between the three-phase grid and/or the three-phase load and the filter. Loads are generally electric motors, without being restricted to those. The input and output terminals 23 and 24 are realised as cable clamps as shown in FIGS. 2 and 4. However, it is also possible for the filter together with a further load-side device to form one unit and for the output terminal 24 to constitute only the imaginary boundary in an electrical line between the further load-side device and the filter. However, it is also possible for the filter together with a further grid-side device to form one unit and for the input terminal 23 to constitute only the imaginary boundary in an electrical line between the further grid-side device and the filter.

Each electrical conductor has the first coil 1 of the first coil block 16 between the input terminal 23 and a connection point. The connection points of the three phases L1, L2, L3 are connected via the three second coils 2 and the three capacitors 4 via the circuit 26 in star and/or delta connection. FIGS. 1, 1A, 1B and 1C show four possible circuits 26. Further circuits of the capacitors 4 and of the second coils 2 are possible. In this case, the second coil 2 has a lower inductance than the first coil 1 (in the same phase). Each connection point of one of the three phases L1, L2, L3 is electrically connected to the output terminal 24 of the corresponding phase L1, L2, L3.

In FIG. 1, the three second coils 2 and the three capacitors 4 both connect the three connection points in star form in the circuit 26. Each connection point of the three phases L1, L2, L3 is electrically connected to a common star point, wherein the second coil 2 of the second coil block 17 and one of the three capacitors 4 are connected between the connection point and the star point for each phase. Preferably, in this case, the second coil 2 is arranged on the side of the connection point and the capacitor 4 is arranged on the side of the star point.

Figure 1A:
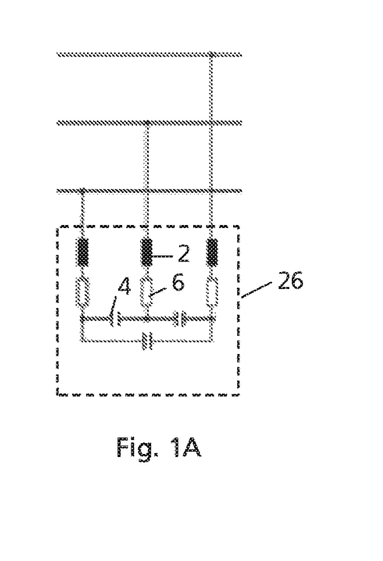
FIG. 1A shows a first alternative circuit for the second coils and the capacitors.

In FIG. 1A, the three connection points are connected to the three second coils 2 in star form and to the three capacitors 4 in delta form. Each connection point of the three phases L1, L2, L3 here is electrically connected to a further connection point of the corresponding phase, wherein the second coil 2 of the second coil block 17 is connected between the connection point and further connecting point for each phase. By contrast, the three capacitors 4 are connected in delta form between the three further connecting points, i.e. one capacitor 4 between each two further connecting points.

Figure 1B:
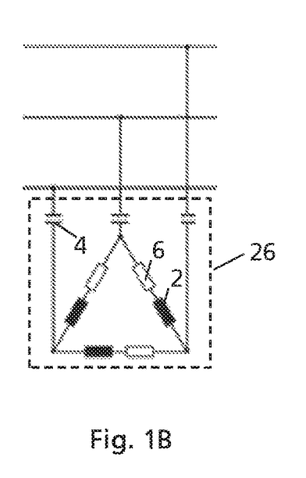
FIG. 1B shows a second alternative circuit for the second coils and the capacitors.

In FIG. 1B, the three connection points are connected to the three second coils 2 in delta form and to the three capacitors 4 in star form. Each connection point of the three phases L1, L2, L3 here is electrically connected to a further connecting point of the corresponding phase, wherein a capacitor 4 is connected between the connection point and further connecting point for each phase. By contrast, the three second coils of the second coil block 17 are connected in delta form between the three further connecting points, i.e. one second coil 2 between each two further connecting points.

Figure 1C:
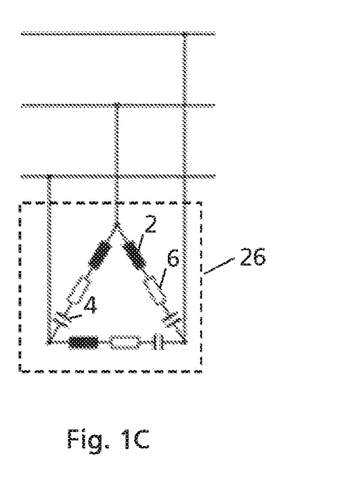
FIG. 1C shows a third alternative circuit for the second coils and the capacitors.

In FIG. 1C, the three connection points are connected to the three second coils 2 and to the three capacitors 4 in delta form. In each case the second coil 2 of the second coil block 17 and one of the three capacitors 4 are connected between each pair of the three connection points.

The filter preferably further comprises a fan 8 for actively cooling the first coil block 16 and possibly the second coil block 17 and/or the third coil block 18. In one embodiment, the necessary power for the fan 8 is drawn directly from the current-carrying phases L1, L2, L3. In the module shown, the fan 8 is supplied by two of the three phases L1, L2, L3. In one embodiment, a power module 9 controls the necessary power for the fan. It would also be possible, of course, to supply the fan 8 using a different current source, e.g. an external power supply. The fan 8 can also consist of a plurality of fan units, as is shown in FIG. 4, in order to increase the cooling power. In one embodiment, the fan 8 is arranged such that the air flow moves from the first side of the housing to the second side thereof. In one embodiment, the fan 8 is arranged on the first side of the housing in order to force the air flow into the housing.

Optionally, the filter can be supplemented by the third coil block 18, such that the third coil 3 of the third coil block 18 is connected between the connection point and the output terminal 24 of each phase. The third coil 3 has a lower inductance than the second coil 2 (in the same phase).

Optionally, the circuit 26 can furthermore comprise three resistors 6. In FIG. 1, one of the three resistors 6 is connected in parallel with each of the three capacitors 4. In FIGS. 1A to 1C, each second coil 2 is connected in series with one of the three resistors 6. However, other circuit connections of the coils are also possible. The resistors 6 enable the capacitors 4 to be discharged after the device has been switched off.

Optionally, the filter can comprise a damping block 10. The damping block 10 provides an RC element (series connection of resistor and capacitor, or vice-versa) in parallel with the first coil 1 for each phase L1, L2, L3 between the input terminal 23 and the connection point. Said RC element serves for effectively damping harmonics generated by the resonant circuit comprising the first coil 1, the second coil 2 and the capacitor 4 in a phase. Details concerning the damping block 10 are disclosed in U.S. Pat. No. 8,115,571 and are incorporated by reference here.

Optionally, the filter can comprise a switching module 11. The switching module 11 is connected between the second coil block 17 and the three capacitors 4. Preferably, the switching module 11 allows, for each phase, the connection between the second coil 2 and the capacitor 4 of the same phase to be disconnected. Said switching module can for example be formed by six connecting terminals, wherein in each case two connecting terminals of a phase are connected to a cable. The user can then disconnect the capacitors 4 by removing the connection cables. By disconnecting/switching off the capacitors 4, it is possible to switch off the capacitors 4 for situations with low consumption currents, in order thus to eliminate capacitive currents in this consumption situation.

The housing 14 of FIG. 2 is designed for accommodating the first coil block 16 and the second coil block 17. The housing 14 comprises at least a first side and an opposite second side. The fan 8 is arranged on the first side, said fan guiding ambient air into the housing 14 through an opening. Preferably, the second side of the housing 14 comprises openings in order to guide the air flow of the fan 8 out of the housing 14 again. Consequently, the air flow moves from the first side of the housing 14 to the second side thereof. However, the openings could alternatively also be arranged on other sides of the housing 14. The first coil block 16 and the second coil block 17 are then arranged in a line between the first and second sides, such that the air flow of the fan 8 transports away the heat of the first and second coils 1 and 2.

A special feature of this filter is that the first coil block 16, which, on account of the highest inductance of the first coils, also has the largest spatial dimensions, is arranged between the fan 8 and the smaller second coil block 17. This initially appears illogical since the smaller coil block 17 is situated in the wind shadow of the larger coil block 16 and is therefore not cooled. Nevertheless, it has been found that the total power loss with this arrangement is significantly reduced in comparison with an arrangement in which the coil blocks 16 and 17 are interchanged. This is presumably owing to the fact that the largest coil block 16 is also the cause of the highest heat loss and the optimum cooling thereof leads to a reduced heat loss despite the lack of cooling of the other coil blocks 17 and possibly 18.

Preferably, the form of the housing 14 is adapted such that the second coil block 17 is cooled or at least better cooled by the air flow despite this arrangement. This is achieved by a tapering of the housing 14 from the first side in the direction of the second side. Firstly, this leads to a kind of chimney effect that compresses and accelerates the air flow in the direction of the second side and thus improves the cooling of the second coil block 17 arranged in the direction of the second side. Secondly, said tapering also has the effect that the air flow of the fan 8 downstream of the first coil block 16 is guided back to the second coil block 17 again, such that the latter is better cooled.

Preferably, the tapering of the housing 14 is achieved by one side being arranged at an angle (i.e. not parallel) to the opposite side. Preferably, the angle is preferably less than 30°, preferably less than 20°, preferably less than 10°. Preferably, the angle is greater than 0°, preferably greater than 1°, preferably greater than 2°, preferably greater than 3°. Preferably, the angled (fourth) side is opposite the (third) side of the housing 14, which is designed for mounting the filter on a wall and/or for fixing the first coil block 16 and the second coil block 17. Preferably, the housing 14 comprises six side faces, wherein the first side is arranged opposite the second side, the third side is arranged opposite the fourth side, and the fifth side is arranged opposite the sixth side. Of these sides preferably five sides are arranged at right angles to one another, i.e. the first, second, third, fifth and sixth sides. The remaining (fourth) side is arranged at the abovementioned angle to the opposite (third) side. However, the other five sides can also be arranged otherwise other than at right angles. It is likewise possible for at least two sides not to be arranged at right angles and for the at least two sides to contribute to the tapering of the housing 14 in the direction of the second side.

Preferably, the filter is mounted or suspended such that the first side of the housing 14 is arranged at the bottom with respect to Earth's gravitational force, and the second side of the housing 14 at the top. This further supports an optimum cooling since the air flow of the fan 8 is oriented in the direction of the natural heat transfer and a particularly laminar and effective air flow for cooling the coil blocks 16, 17 and possibly 18 can thus be achieved. To that end, preferably the third side comprises mounting or suspension means 21 in order to fix the filter on a wall.

The three capacitors 4, by contrast, which do not require active cooling, are fixed/mounted outside the housing 14 on one of the exterior sides of the housing 14. This is preferably the angled (fourth) side. Optionally, the capacitors 4 arranged outside the housing 14 are covered by a housing cover 15 of FIG. 5. The latter preferably also covers the (entire) side of the housing 14 on which the capacitors 4 are mounted on the exterior side, e.g. on the fourth side.

On a side of the housing 14, e.g. the fourth side, on which the capacitors 4 are fixed/mounted, the input and output terminals 23 and 24 are preferably fixed/mounted. These are preferably fixed/mounted on the exterior side of the housing 14. Preferably, these are arranged towards the first side, i.e. at the bottom when the filter is suspended/mounted, which simplifies accessibility.

If the optional switching module 11 is included, then it is preferably arranged above the input and output terminals 23 and 24, such that it is likewise easily operable and accessible.

The input and output terminals 23 and 24 and possibly the optional switching module 11 are arranged at an opening of the housing cover 15, if the optional housing cover 15 is used. In this case, the input and output terminals 23 and 24 and possibly the optional switching module 11 can also be covered by a further cover 22, such that all electrically conductive elements are covered by the housing 14 and the covers 15 and 22 and cannot be touched by a user during operation.

If the optional damping module 10 is included, then this is preferably arranged in the housing 14. Preferably, this is arranged between the first side and the first coil block 16.

In one preferred exemplary embodiment, the optional third coil block 18 is likewise included. Depending on the size of the filter, there are then various exemplary embodiments.

In the first exemplary embodiment in FIGS. 2 to 4, the third coil block 18 is likewise mounted in the housing 14. The third coil block 18 is arranged together with the first coil block 16 and the second coil block 17 in a line between the first side and the second side. Since the third coil block 18 is likewise smaller than the second coil block 17 and the second coil block 17 is arranged between the first coil block 16 and the third coil block 18, the same explanations as given analogously regarding the second coil block 17 in relation to the first coil block 16 hold true regarding the third coil block 18 in relation to the second coil block 17. To summarize, the coil blocks 16, 17, 18 becoming smaller in the direction of the second side, despite the covering by the largest coil block 16, are effectively cooled by virtue of the tapering form of the housing 14 in the direction of the second side. In this embodiment, the three coil blocks are arranged in a line in the housing 14. This is advantageous particularly for large filters, i.e. filters for high powers, since the capacitors 4 thereof are so large that the three capacitors 4 are likewise mounted/fixed in a line on the fourth side in the direction from the first side to the second side and/or since the third coil block 18 is already very heavy and a very solid construction of the housing 14 is otherwise needed. The capacitors 4 are in each case preferably formed as a capacitor bank comprising two or three or more capacitors connected in parallel. Preferably, the parallel-connected capacitors of a capacitor bank 4 are arranged in the direction from the fifth to the sixth side (perpendicular to the line from the first side to the second side). The first exemplary embodiment is advantageous in particular for power ranges of greater than 55 kW.

In the second exemplary embodiment in FIGS. 5 to 7, the third coil block 18 is arranged together with the three capacitors 4 on the exterior of a side of the housing 14, e.g. the fourth side. The three capacitors 4 are lined up successively here in the direction from the fifth to the sixth side. Optionally, the three capacitors 4 and the third coil block 18 can be covered by the housing cover 15. In this case, the housing cover 15 should also have openings for heat extraction on the second side. Preferably, the fourth side comprises at least one opening 25 in order to guide the air flow of the fan 8 also to the third coil block 18 on the exterior side of the housing 14 in order to cool it. Two openings 25 arranged in a manner spaced apart in a line between the first side and the second side are preferably used for this purpose. This generates a more laminar air flow than if a single larger opening had been arranged in the fourth side. Preferably, the first opening 25 is arranged below the capacitors 4 on the side arranged towards the third coil block 18, such that the capacitors 4 divert the air flow in the direction of the third coil block 18. The second opening 25 is arranged alongside the third coil block 18 in the direction of the capacitors 4. The second exemplary embodiment is advantageous in particular for power ranges of less than 55 kW.

In the exemplary embodiments described, the first coil 1 is larger than the second coil 2. However, applications are also possible in which the second coil 2 has a higher inductance than the first coil 1 and the in that case larger second coil block 17 is arranged between the fan 8 and the first coil block 16.

According to the invention, the coil blocks 16, 17, 18 are lined up according to size proceeding from the fan 8, such that the largest coil block is arranged the closest to the fan 8 and the smallest coil block is the furthest away. The size of a coil block is defined by the spatial size of the coil block and/or by the size of the inductances of the coils of the coil block. In general, the spatially largest coil block is also the coil block having the coils having the largest inductances. However, there may also be exemplary embodiments in which the spatially larger coil block has coils having smaller inductances or inductances of the same magnitude in comparison with coils of a spatially smaller coil block. Since there are advantages both in arranging the coil block having the larger inductances at the fan 8 and in arranging the coil block having the largest spatial extent at the fan 8, the largest coil block is intended to be able to be designed both as a coil block having the largest inductances and as a coil block having the largest spatial extent.

The spatial size of a coil block can be measured for example by the volume thereof or the cross-sectional area thereof perpendicular to the line in which the coil blocks are arranged. Preferably, however, the cross-sectional area perpendicular to the line in which the coil blocks are arranged is used as a measure of the spatial size.

The filter is preferably an electromagnetic compatibility filter (EMC filter) and/or a grid quality filter.

In the exemplary embodiment described above, the inductance of phase L1 the first coil 1 was greater than the inductance of phase L2 of the second coil 2, and the inductance of phase L2 of the second coil 2 was greater than the inductance of phase L2 the third coil 3. However, inductances of phase L2>L3>L1 or L3>L2>L1 can also hold true. It is also possible for two or three of the first coil 1, the second coil 2 and the third coil 3 to have the same inductance. Preferably, the coil block having the coils having the largest inductance is positioned between the fan 8 and the coil block having the coils having the second largest inductance, that is to say that, in FIGS. 2 and 4, the coil block having the coils having the largest inductance is arranged in place of the coil block 16 and the coil block having the coils having the second largest inductance is arranged in place of the coil block 17. The optional coil block having the coils having the third largest inductance is arranged in place of the coil block 18.

In the exemplary embodiment described above, the spatial extent D1 of the first coil block 16 was larger than the spatial extent D2 of the second coil 2, and the spatial extent D2 of the second coil 2 was larger than the spatial extent D3 of the third coil 3. However, D2>D3>D1 or D3>D2>D1 can also hold true. It is also possible for two or three of the first coil 1, the second coil 2 and the third coil 3 to have the same spatial extent. Preferably, the spatial extent is the extent at right angles to the line between the first and second sides. Preferably, the coil block having the largest spatial extent is positioned between the fan 8 and the coil block having the second largest spatial extent, that is to say that, in FIGS. 2 and 4, the coil block having the largest spatial extent is arranged in place of the coil block 16 and the coil block having the second largest spatial extent is arranged in place of the coil block 17. The optional coil block having the third largest spatial extent is arranged in place of the coil block 18.

In the exemplary embodiment described above, three coils 1, 2 and 3 and their three coil blocks 16, 17, 18 were described. However, the filter can also comprise only two of these three coils 1, 2 and 3 in each phase or comprise only two of the three coil blocks 16, 17 and 18. The third coil 3 has already been previously described as optional. However, an exemplary embodiment is also possible in which the first coil 1 is absent, and the filter comprises only the second coil 2 and the third coil 3, as is the case e.g. in an output filter. An exemplary embodiment is likewise conceivable in which the second coil 2 is absent, and the filter comprises only the first coil and third coil 3, as is the case e.g. in an LCL filter.

The invention claimed is:

1. Filter with three phases comprising for each phase a respective input terminal, a respective output terminal and a respective capacitor, wherein for each of the three phases the input terminal is electrically connected via a connection point to the output terminal, wherein the connection points of the three phases are electrically connected via the respective capacitors in star or delta form, wherein the filter comprises a housing containing two coil blocks, wherein the housing comprises a first side and a second side opposite the first side, wherein the two coil blocks are arranged along a line between the first side and the second side, wherein the housing tapers from the first side towards the second side, wherein the housing comprises a third side for fixing the filter on a wall or for fixing the two coil blocks and a fourth side opposite the third side, wherein the distance between the third side and the fourth side decreases in the direction toward the second side, wherein the two coil blocks are selected from two of the following three coil blocks:
   an input-side coil block having three input-side coils, wherein for each of the three phases one of the three input-side coils is connected between the connection point and the input terminal,
   a secondary coil block having three secondary coils, wherein the connection points of the three phases are electrically connected via the three secondary coils and the three capacitors in star form or in delta form or in a combination of a star and delta form, and
   an output-side coil block having three output-side coils, wherein for each of the three phases one of the three output-side coils is connected between the connection point and the output terminal.

2. Filter according to claim 1, wherein a larger of the two coil blocks is arranged between the first side of the housing and a smaller of the two coil blocks.

3. Filter according to claim 2, wherein a fan for cooling the two coil blocks is arranged on the first side of the housing.

4. Filter according to claim 3, wherein a spatial extent of the larger coil block is larger than the spatial extent of the smaller coil block.

5. Filter according to claim 1, wherein the three capacitors are fixed on an exterior of the fourth side of the housing.

6. Filter according to claim 5, wherein the filter comprises three coil blocks comprising the input-side coil block, the secondary coil block and the output-side coil block, wherein a largest of the three coil blocks is arranged between the first side of the housing and a second largest of the two coil blocks, wherein a third largest of the three coil blocks is fixed on the exterior of the fourth side of the housing.

7. Filter according to claim 6, wherein the third largest of the three coil blocks is arranged above the second largest of the three coil blocks, and the capacitors are arranged above the largest of the three coil blocks.

8. Filter according to claim 7, wherein a fan for cooling the three coil blocks is arranged on the first side or second side of the housing, wherein the fourth side of the housing comprises a cutout between the capacitors and the third largest of the three coil blocks, which guides a cooling air flow of the fan to the third largest of the three coil blocks.

9. Filter according to claim 1, wherein the filter comprises the three coil blocks comprising the input-side coil block, the secondary coil block and the output-side coil block, wherein a largest of the three coil blocks is arranged between the first side of the housing and a second largest of the two coil blocks, wherein the third largest of the three coil blocks is arranged in the housing between the second largest coil block and the second side.

10. Filter according to claim 9, wherein the respective capacitors of the three phases are arranged on an exterior of the fourth side of the housing along a line between the first side and the second side of the housing.

11. Filter according to claim 10 comprising a housing cover for covering the three capacitors on the fourth side of the housing.

12. Filter according to claim 11, wherein the housing cover, in a direction of the first side toward the housing, leaves free a part of the fourth side on which the input terminals and the output terminals are arranged.

13. Filter according to claim 1, wherein the two selected coil blocks are the input-side coil block and the secondary coil block.

14. Filter according to claim 1, wherein the housing comprises suspension means on the third side in order to fix the filler by the third side on the wall such that the first side faces downwards or the second side faces upwards.

15. Filter system comprising a vertical wall and a filter, wherein the filter comprises three phases, wherein the filter comprises for each phase a respective input terminal, a respective output terminal and a respective capacitor, wherein for each of the three phases the input terminal is electrically connected via a connection point to the output terminal, wherein the connection points of the three phases are electrically connected via the three respective capacitors in star or delta form, wherein the filter comprises a housing containing two coil blocks, wherein the housing comprises a first side, a second side opposite the first side and a third side, wherein the two coil blocks are arranged along a line between the first side and the second side, wherein the housing is fixed with the third side on the vertical wall such that the first side of the housing is directed downwards and the second side of the housing is directed upwards, wherein the two coil blocks are selected from two of the following three coil blocks:

- an input-side coil block having three input-side coils, wherein for each of the three phases one of the input-side first coils is connected between the connection point and the input terminal,
- a secondary coil block having three second coils, wherein the connection points of the three phases are electrically connected via the three secondary coils and the three respective capacitors in star form or delta form or a combination of star form and delta form, and
- an output-side coil block having three output-side coils, wherein for each of the three phases one of the three output-side coils is connected between the connection point and the output terminal.

16. Filter system according to claim 15, wherein a fan for cooling the two coil blocks is arranged on the first side of the housing, wherein a larger of the two coil blocks is arranged between the fan and a smaller of the two coil blocks.

17. Filter system according to claim 15, wherein the housing tapers from the first side towards the second side.

18. Filter system according to claim 17, wherein the housing comprises a fourth side opposite the third side, wherein the distance between the third side and the fourth side decreases in a direction toward the first or second side.

19. Filter system according to claim 18, wherein the distance between the third side and the fourth side decreases in the direction of the second side.

* * * * *